US012584039B2

(12) United States Patent
Shin et al.

(10) Patent No.: US 12,584,039 B2
(45) Date of Patent: Mar. 24, 2026

(54) SLURRY COMPOSITION FOR A CHEMICAL MECHANICAL POLISHING

(71) Applicants: SK hynix Inc., Icheon (KR); INDUSTRY-UNIVERSITY COOPERATION FOUNDATION HANYANG UNIVERSITY, Seoul (KR)

(72) Inventors: Cheol Min Shin, Icheon (KR); Hyun Goo Kang, Icheon (KR); Ungyu Paik, Seoul (KR); Taeseup Song, Seoul (KR); Hojin Jeong, Seoul (KR)

(73) Assignees: SK hynix Inc., Icheon (KR); INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 272 days.

(21) Appl. No.: 18/459,173

(22) Filed: Aug. 31, 2023

(65) Prior Publication Data

US 2024/0271006 A1 Aug. 15, 2024

(30) Foreign Application Priority Data

Feb. 9, 2023 (KR) ........................ 10-2023-0017380

(51) Int. Cl.
| | |
|---|---|
| *C09G 1/02* | (2006.01) |
| *H01L 21/306* | (2006.01) |
| *H01L 21/321* | (2006.01) |

(52) U.S. Cl.
CPC .......... *C09G 1/02* (2013.01); *H01L 21/30625* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 6,616,514 B1 | 9/2003 | Edelbach et al. | |
| 2022/0235247 A1* | 7/2022 | Johnson | .............. H01L 21/3212 |
| 2022/0298380 A1* | 9/2022 | Yoshizaki | .......... H01L 21/3212 |

FOREIGN PATENT DOCUMENTS

KR 1020200082069 A 7/2020

* cited by examiner

*Primary Examiner* — Roberts P Culbert

(57) ABSTRACT

A slurry composition may include an abrasive, a solvent, and polyol. The abrasive may include any one of metal oxide, metal nitride, metal oxynitride, and a combination thereof. The polyol may have about 0.01 mM to about 500 mM of a concentration. Thus, high polishing selectivities may be provided between a B—Si layer, a TiN layer and a SiN layer by controlling a polishing rate of the TiN layer.

7 Claims, 6 Drawing Sheets

SLURRY COMPOSITION FOR A CHEMICAL MECHANICAL POLISHING

CROSS-REFERENCE TO RELATED APPLICATION

The present application claims priority under 35 U.S.C. § 119(a) to Korean application number 10-2023-0017380, filed on Feb. 9, 2023, in the Korean Intellectual Property Office, which is incorporated herein by reference in its entirety.

BACKGROUND

1. Technical Field

Various embodiments generally relate to a slurry composition for a chemical mechanical polishing, particularly, to a slurry composition capable of substantially preventing an oxidation of an object and securing a polishing selectivity.

2. Related Art

Generally, in processes for manufacturing a semiconductor integrated circuit, a chemical mechanical polishing (CMP) process may be used for planarizing a surface of a wafer.

A polishing pad may make contact with the wafer together with a slurry composition. The polishing pad may frictionally make contact with the surface of the wafer by an orbital movement including a rotation movement and a linear movement to planarize the surface of the wafer.

The slurry composition may include an abrasive and an active component. The abrasive may function as a physical friction action. The active component may function as a chemical action. Because objects may have different polishing rates, various slurry compositions by the objects may be used.

Recently, an improvement of a polishing rate of a layer (e.g., TiN layer), which may be used as a barrier layer and electrodes in a semiconductor device, has been studied. Further, addressing potential issues related to property changes in a CMP process of such a layer also has been studied.

SUMMARY

According to example embodiments, there may be provided a slurry composition for a CMP. The slurry composition may include an abrasive, a solvent and polyol. The abrasive may include at least one of metal oxide, metal nitride and metal oxynitride. Specifically, the abrasive may include any one of metal oxide, metal nitride, metal oxynitride, and a combination thereof. In the present disclosure, "any one of . . . and" indicates a disjunctive list of items. For example, "any one of A, B, C, and a combination thereof" indicates "only A, or only B, only C, or both A and B, or both A and C, or both B and C, or all of A and B and C." The polyol may have about 0.01 mM to about 500 mM of a concentration.

In example embodiments, the abrasive may include at least one of silica, ceria, alumina, zirconia and titania. Specifically, the abrasive may include any one of silica, ceria, alumina, zirconia, titania, and a combination thereof.

In example embodiments, the polyol may include a polyol in alkane group having about 10 g/mol to about 1,000 g/mol of molecular weight. The polyol may include any one of ethylene glycol, diethylene glycol, triethylene glycol, tetraethylene glycol, dipropylene glycol, tripropylene glycol, 1,3-propanediol, 1,2-propanediol, 1,4-butanediol, neopentyl glycol, 2-ethyl-2-butylpropanediol, trimethylpentanediol, diethyloctanediol, 1,3-butylene glycol, cyclohexanediol, 1,4-cyclohexanedimethanol, 1,6-hexanediol, 1, 2-cyclohexanediol, 1,4-cyclohexanediol, hydrogenated bisphenol A (2,2-bis(4-hydroxycyclohexyl)propane), 2,2-dimethyl-3-hydroxypropyl, 2,2-dimethyl-3-hydroxypropionate, trimethylolethane, trimethylolpropane, glycerol, ditrimethylolpropane, pentaerythritol, dipentaerythritol, sorbitol, and a combination thereof.

In example embodiments, the slurry composition may have about 2.5 pH to about 10.5 pH.

In example embodiments, the slurry composition may include a catalyst including any one of iron (Fe), copper (Cu), cerium (Ce), chromium (Cr), cobalt (Co), manganese (Mn), molybdenum (Mo), ruthenium (Ru), titanium (Ti), vanadium (V), and a combination thereof. The slurry composition may further include a PH adjusting agent including any one of sulfuric acid ($H_2SO_4$), phosphoric acid ($H_3PO_4$), hydrochloric acid (HCl), nitric acid ($HNO_3$), carboxylic acid, maleic acid, malonic acid), citric acid, oxalic acid, tartaric acid, calcium hydroxide ($Ca(OH)_2$), potassium hydroxide (KOH), ammonium hydroxide ($NHOH$), sodium hydroxide (NaOH), magnesium hydroxide ($Mg(OH)_2$), triethyl amine, tetramethyl ammonium hydroxide, ammonia ($NH_3$), and a combination thereof.

In example embodiments, the slurry composition may further include any one of a dispersing agent, a surfactant, a polishing inhibitor, a planarizing agent, and a combination thereof.

In example embodiments, when a wafer including B—Si, TiN and SiN may be chemically mechanically polished using the slurry composition, a polishing selectivity between the SiN and the B—Si may be about 1:40 to about 1:100 and a polishing selectivity between the SiN and the TiN may be about 1:1 to about 1:10.

In example embodiments, a CMP method may include applying a slurry composition to a wafer and polishing a surface of the wafer, which may include a storage node electrode, a barrier layer and an etch stopper, using the slurry composition. The slurry composition may include a polyol material absorbed in a surface of the barrier layer by a hydrogen bond.

BRIEF DESCRIPTION OF THE DRAWINGS

The above and another aspects, features and advantages of the subject matter of the present disclosure will be more clearly understood from the following detailed description taken in conjunction with the accompanying drawings, in which.

DETAILED DESCRIPTION

Various embodiments of the present disclosure will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include variations in configurations and shapes.

Embodiments of the present disclosure are described herein with reference to cross-section and/or plan views of the present disclosure. However, it will be appreciated by those of ordinary skill in the art that changes may be made in these embodiments.

Figure 1A:
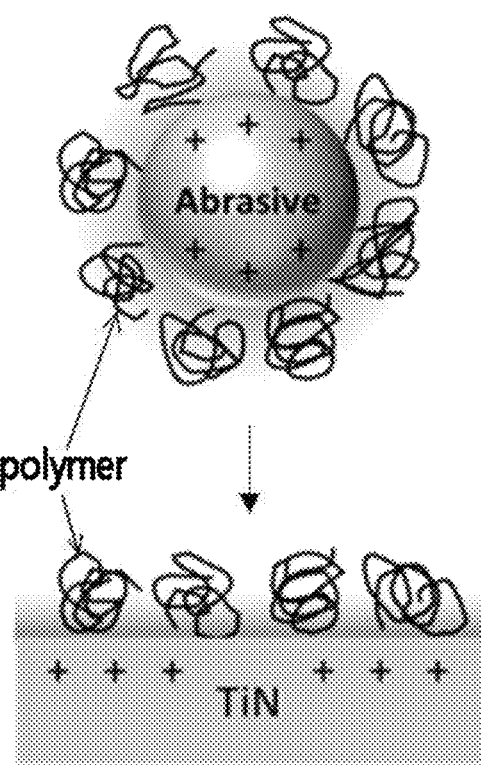
FIG. 1A is a view illustrating a CMP process using a slurry composition.
Figure 1B:
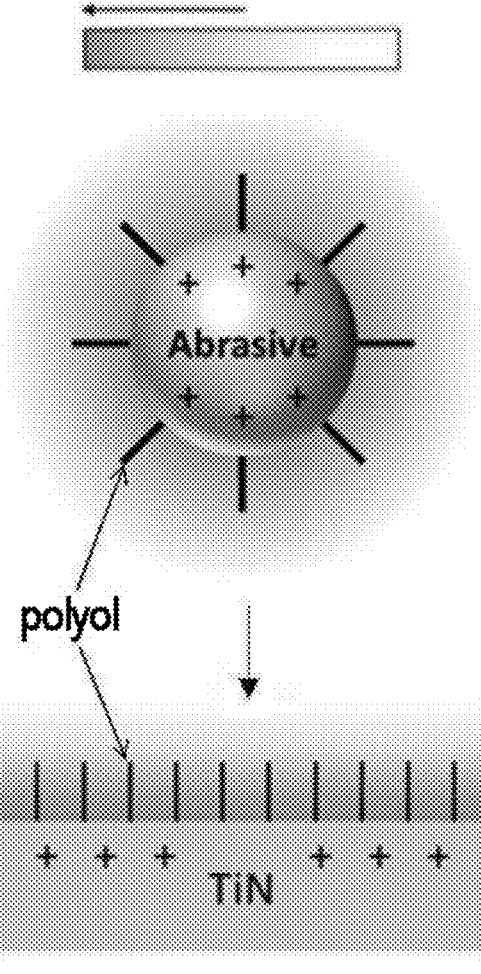
FIG. 1B is a view illustrating a CMP process on a TiN layer using a slurry composition including an antioxidant in accordance with example embodiments.

FIG. 1A is a view illustrating a CMP process using a conventional slurry composition. FIG. 1B is a view illustrating a CMP process on a TiN layer using a slurry composition including an antioxidant in accordance with example embodiments.

Referring to FIG. 1A, a conventional slurry composition may include a polymer. The polymer may be absorbed in an abrasive and a layer (e.g., TiN layer) as an object to generate a screen effect. The screen effect may decrease an electrostatic repulsion between the abrasive of the slurry composition and the TiN layer. Thus, a polishing selectivity and an abrasive zeta potential may be decreased.

In contrast, referring to FIG. 1B, a slurry composition of example embodiments may include polyol having at least two OH group. The polyol may have a molecular weight lower than the polymer. Thus, although the polyol may be absorbed in the abrasive and the TiN layer, the screen effect may be significantly reduced compared to that in the conventional slurry composition as shown in FIG. 1A. Further, the polyol may be absorbed in the TiN layer to suppress a reaction between the TiN layer and water, thereby substantially preventing an oxidation of the TiN layer in a CMP process. Because the polyol may include the OH group, a surface of the TiN layer coated with the polyol may have a positive charge. The abrasive may also have a positive charge by the coating of the polyol. Thus, the electrostatic repulsion between the abrasive and the TiN layer may be maintained to control a polishing speed. Since the screen effect between the abrasive and the TiN layer is significantly reduced due to a relatively low molecular weight of the polyol, the electrostatic repulsion between the abrasive and the TiN layer may be maintained sufficiently great to facilitate controlling the polishing speed. The polyol may not substantially react with a boron-silicon mixture, for example, a boron impurity region or a boron polycide material so that the polishing speed of the TiN layer in polishing the boron-silicon mixture and the TiN layer may be selectively improved.

Particularly, the polyol may include ethylene glycol, diethylene glycol, triethylene glycol, tetraethylene glycol, dipropylene glycol, tripropylene glycol, 1,3-propanediol, 1,2-propanediol, 1,4-butanediol, neopentyl glycol, 2-ethyl-2-butylpropanediol, trimethylpentanediol, diethyloctanediol, 1,3-butylene glycol, cyclohexanediol, 1,4-cyclohexanedimethanol, 1,6-hexanediol, 1,2-cyclohexanediol, 1,4-cyclohexanediol, hydrogenated bisphenol A (2,2-bis(4-hydroxycyclohexyl)propane), 2,2-dimethyl-3-hydroxypropyl, a diol (e.g., 2,2-dimethyl-3-hydroxypropionate), a triol (e.g., trimethylolethane, trimethylolpropane, glycerol, ditrimethylolpropane, pentaerythritol, dipentaerythritol, sorbitol, etc.), or a mixture thereof. For example, the polyol may include any one of ethylene glycol, diethylene glycol, triethylene glycol, tetraethylene glycol, dipropylene glycol, tripropylene glycol, 1,3-propanediol, 1,2-propanediol, 1,4-butanediol, neopentyl glycol, 2-ethyl-2-butylpropanediol, trimethylpentanediol, diethyloctanediol, 1,3-butylene glycol, cyclohexanediol, 1,4-cyclohexanedimethanol, 1,6-hexanediol, 1,2-cyclohexanediol, 1,4-cyclohexanediol, hydrogenated bisphenol A (2,2-bis(4-hydroxycyclohexyl)propane), 2,2-dimethyl-3-hydroxypropyl2, 2-dimethyl-3-hydroxypropionate, trimethylolethane, trimethylolpropane, glycerol, ditrimethylolpropane, pentaerythritol, dipentaerythritol, sorbitol, and a combination thereof. In the present disclosure, "any one of . . . and" indicates a disjunctive list of items, such that "any one of A, B, and a combination thereof" indicates "only A, or only B, or both A and B."

The polyol may include a polyol in an alkane group having no more than about 1,000 g/mol of a molecular weight. For example, the polyol may include 1,3-propanediol, glycerol, sorbitol, a mixture thereof, etc. The slurry composition may include the polyol at a concentration of about 0.01 mM to about 500 mM.

For example, when the slurry composition may include below about 0.01 mM of an antioxidant, i.e., the polyol, an actual oxidation prevention effect may not be sufficiently generated. In contrast, when the slurry composition may include above about 500 mM of the antioxidant, the electrostatic repulsion may be excessively decreased.

The slurry composition may include an amount of about 0.001% to about 0.1% by weight of the polyol to satisfy the concentration of the antioxidant within the above range.

A catalyst may increase a reactivity of the TiN layer to improve the polishing speed. The catalyst may include a single catalyst material or at least two catalyst materials. For example, the catalyst may include any one of Fe, Cu, Ce, Cr, Co, Mn, Mo, Ru, Ti, V, and a combination thereof. The catalyst may include a metallic salt including the above-mentioned metal. The catalyst may include FeON, or CuON, or a mixture thereof.

The slurry composition may include about 0.1 mM to about 500 mM of concentration of the catalyst. When the concentration of the catalyst may be below about 0.1 mM, the polishing speed may be decreased. In contrast, when the concentration of the catalyst may be above about 500 mM, the polishing speed may not be substantially constant.

A pH adjusting agent may function as to control a concentration of hydrogen ions in the slurry composition.

The pH adjusting agent may include one or more acid solutions (e.g., sulfuric acid ($H_2SO_4$), phosphoric acid ($H_3PO_4$), hydrochloric acid (HCl), nitric acid ($HNO_3$), carboxylic acid, maleic acid, malonic acid, citric acid, oxalic acid (oxalic acid), tartaric acid, etc.), or one or more alkali solutions (e.g., calcium hydroxide ($Ca(OH)_2$), potassium hydroxide (KOH), ammonium hydroxide ($NH_4OH$), sodium hydroxide (NaOH), magnesium hydroxide ($Mg(OH)2$), triethyl amine, tetramethyl ammonium hydroxide, ammonia ($NH_3$), etc.), or mixtures thereof. For example, the pH adjusting agent may include any one of sulfuric acid ($H_2SO_4$), phosphoric acid ($H_3PO_4$), hydrochloric acid (HCl), nitric acid ($HNO_3$), carboxylic acid, maleic acid, malonic acid, citric acid, oxalic acid, tartaric acid, calcium hydroxide (Ca(OH)$_2$), potassium hydroxide (KOH), ammonium hydroxide (NH4OH), sodium hydroxide (NaOH), magnesium hydroxide (Mg(OH)2), triethyl amine, tetramethyl ammonium hydroxide, ammonia (NH3), and a combination thereof.

The pH adjusting agent may maintain a pH of the slurry composition in about 2.5 to about 10.5.

A solvent may uniformly disperse the abrasives in the slurry composition. The solvent may include a solution, but embodiments of the present disclosure are not limited thereto. The solvent may include a water-based solvent, an organic solvent, etc.

For example, the solvent may include the water-based solvent such as water, deionized water or ultrapure water. The solvent may include the organic solvent in alcohol group having about 1 to about 15 of carbon number or in ether group having about 2 to about 20 of carbon number.

The slurry composition may further include an addition agent. The addition agent may include a dispersing agent, a surfactant, a polishing inhibitor, a planarizing agent, a mixture thereof, etc. Specifically, the addition agent may include any one of a dispersing agent, a surfactant, a polishing inhibitor, a planarizing agent, and a combination thereof.

The dispersing agent may improve dispersion of the abrasives. For example, the dispersing agent may include a non-ionic polymer or a positive ion organic compound.

The dispersing agent may include ethylene oxide, ethylene glycol, glycol distearate, glycol monostearate, glycol polymerate, glycol ethers, alkylamines (alkylamine-containing alcohols, polymerate ether-containing compounds, vinyl pyrrolidone, celluloses, and ethoxylate-based compounds.

The dispersing agent may include diethylene glycol hexadecyl ether, decaethylene glycol hexadecyl ether, diethylene glycol octadecyl ether, eicosaethylene glycol octadecyl ether ether), diethylene glycol oleyl ether, decaethylene glycol oleyl ether, decaethylene glycol octadecyl ether, nonylphenol polyethylene glycol ether glycol ether), ethylenediamine tetrakis(ethoxylate-block-propoxylate)tetrol, ethylenediamine tetrakis(propoxylate-block-ethoxylate)tetrol (ethylenediamine tetrakis(propoxylate-block-ethoxylate) tetrol), polyethylene-blockpoly(ethylene glycol), polyoxyethylene isooctylphenyl ether, polyoxyethylene octiphenyl Ether (polyoxyethylene octylphenyl ether), polyoxyethylene tridecyl ether (polyoxyethylene tridecyl ether), polyoxyethylene sorbitan tetraoleate (polyoxyethylene sorbitantetraoleate), Polyoxyethylene sorbitol hexaoleate, polyethylene glycol sorbitan monolaurate, polyoxyethylenesorbitan monolaurate, sorbitan monopalmitate, FS-300 monoionic fluorosurfactant, FS-300 nonionic fluorosurfactant, FSN nonionic fluorosurfactant, FSO nonionic ethoxylated fluorosurfactant), vinyl pyrrolidone, cellulose, 2,4,7, 9,-tetramethyl-5-dicin-4,7-diol ethoxylate (2,4,7,9-Tetramethyl-5-decyne-4,7-diol ethoxylate), 8-Methyl-1-nonanol propoxylate-block-ethoxylate, aryl alcohol 1,2-butoxylate-block-ethoxylate, polyoxyethylene branched nonylcyclohexyl ether, polyoxyethylene isooctyl cyclohexyl ether (polyoxyethylene isooctylcyclohexyl ether), or a mixture thereof.

The slurry composition may include an amount of about 0.1% of about 1% by weight of the dispersing agent.

The surfactant may include any one of a non-ionic surfactant, a cationic surfactant, an anionic surfactant, an amphoteric surfactant, and a combination thereof.

Particularly, the non-ionic surfactant may include polyoxyethylene alkyl ethers such as polyoxyethylene lauryl ether and polyoxyethylene stearyl ether, polyoxyethylene alkyl phenyl ethers such as polyoxyethylene octylphenyl ether and polyoxyethylene nonierphenyl ether, Sorbitan higher fatty acid esters such as sorbitan monolaurate, sorbitan monostearate and sorbitan trioleate, polyoxyethylene sorbitan higher fatty acid esters such as polyoxyethylene sorbitan monolaurate, polyoxyethylene monolaurate, poly polyoxyethylene higher fatty acid esters such as oxyethylene monostearate; glycerin higher fatty acid esters such as oleic acid monoglyceride and stearic acid monoglyceride; polyoxyalkylenes such as polyoxyethylene, polyoxypropylene and polyoxybutylene, or copolymers thereof.

The cationic surfactant may include alkyltrimethylammonium chloride, dialkyldimethylammonium chloride, benzalkonium chloride salt, alkyldimethylammonium ethosulfate, etc.

The anionic surfactant may include carboxylates such as sodium laurate, sodium oleate, N-acyl-N-methylglycine sodium salt, and sodium polyoxyethylene lauryl ether carboxylate; sulfonic acid salts such as sodium dodecylbenzenesulfonate, dialkylsulfosuccinic acid ester salts, and sodium dimethyl-5-sulfoisophthalate; and sulfuric acid ester salts such as sodium lauryl sulfate, sodium polyoxyethylene lauryl ether sulfate, and sodium polyoxyethylene nonylphenyl ether sulfate, and phosphoric acid ester salts such as sodium polyoxyethylene lauryl phosphate and sodium polyoxyethylene nonylphenyl ether phosphate.

The amphoteric surfactant may include carboxybetaine, aminocarboxylic acid salts, imidazolinium phetaine, lecithin, alkylamine oxides, or mixtures thereof.

The slurry composition may include an amount of about 0.001% of about 0.5% by weight of the surfactant.

The slurry composition may further include a polishing inhibitor.

The polishing inhibitor may include a nitrogen-containing compound, for example, a low molecular weight nitrogen-containing heterocyclic compound such as amine, 1,2,3-triazole, 1,2,4-triazole, and the like.

The slurry composition may include an amount of 0.1% to 1% by weight of the polishing inhibitor.

The slurry composition may further include a leveling agent. The leveling agent may decrease an uneven portion of the surface of the object.

The leveling agent may include ammonium chloride, ammonium lauryl sulfate, polyethylene glycol, polyoxyethylene alkyl ether sulfate triethanolamine, polyvinylpyrrolidone, or polyacrolein.

The slurry composition may include an amount of about 0.1% to about 1% by weight of the planarizing agent.

A polishing method (e.g., CMP method) according to an embodiment may include applying the slurry composition to a wafer, and polishing a surface of the wafer that includes a storage node electrode (e.g., a silicon layer doped with boron), a barrier layer (e.g., a TiN layer), and an etch stopper (e.g., a silicon nitride layer) using the slurry composition. For example, when the surface of the wafer including B—Si, TiN and SiN may be polished using the slurry composition including the polyol, a polishing selectivity between the SiN and the B—Si may be about 1:40 to about 1:100 and a polishing selectivity between the SiN and the TiN may be about 1:1 to about 1:10.

When the wafer may be polished using the slurry composition of example embodiments, the wafer may be polished by a polishing selectivity between the B—Si, the TiN, the SiN of about 40~60:1.5~35:1.

For example, when the surface of the wafer including the B—Si, the TiN and the SiN may be polished using the slurry composition, a polishing rate of the B—Si may be about 750

Å/m to about 850 Å/m, a polishing rate of the SiN may be about 10 Å/m to about 20 Å/m, and a polishing rate of the TiN may be about 20 Å/m to about 50 Å/m.

The high polishing selectivity between the B—Si and the TiN and between the B—Si and the SiN may be secured by the slurry composition of example embodiments.

The slurry composition of example embodiments may be used for polishing a barrier layer including TiN, a storage node electrode including B—Si, an etch stopper including SiN, etc.

Further, the slurry composition of example embodiments may maintain a zeta potential of no less than about 80% with respect to the general slurry composition. A zeta potential of the TiN may be maintained in no less than about 80%.

Hereinafter, example embodiments may be illustrated in detail. However, the following embodiments may be merely examples, and embodiments of the present disclosure are not limited thereto.

<Example 1 (or Case 1) According to an Embodiment of the Present Disclosure

A slurry composition was manufactured using an abrasive including 1% by weight of silica, an antioxidant (polyol) including 0.5 mM molecular weight of 1,3-propane diol, a catalyst including 1 mM molecular weight of $Fe(No_3)_3$ and 0.5 mM molecular weight of $Cu(NO_3)_2$ and a solvent including water.

Example 2 (or Case 2) According to an Embodiment of the Present Disclosure

A slurry composition was manufactured using an abrasive including 1% by weight of silica, an antioxidant (polyol) including 0.5 mM molecular weight of glycerol, a catalyst including 1 mM molecular weight of $Fe(No_3)_3$ and 0.5 mM molecular weight of $Cu(NO_3)_2$ and a solvent including water.

Comparative Example (or Case 3)

A slurry composition was manufactured using an abrasive including 1% by weight of silica, a catalyst including 1 mM molecular weight of $Fe(No_3)_3$ and 0.5 mM molecular weight of $Cu(NO_3)_2$ and a solvent including water.

Experiments

Evaluating Polishing Selectivities

Figure 2:
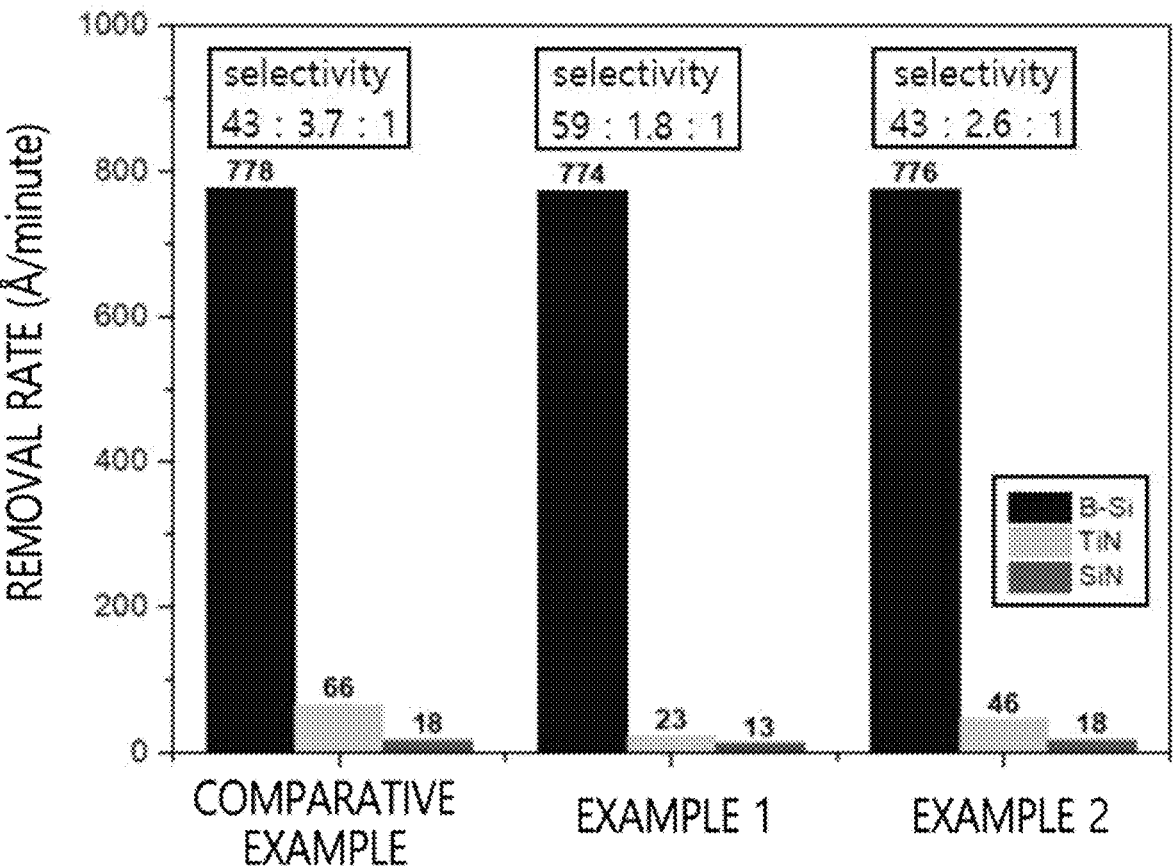
FIG. 2 is a graph showing a polishing rate in accordance with kinds of the slurry composition in accordance with example embodiments.

Table 1 and FIG. 2 may show polishing speeds and polishing selectivity of the B—Si, the TiN and the SiN using the slurry compositions in Case 1 to 3.

|  | B—Si | TiN | SiN | Selectivity |
|---|---|---|---|---|
| Case 1/ Example 1 | 774 Å/min | 23 Å/min | 13 Å/min | 59:1.8:1 |
| Case 2/ Example 2 | 776 Å/min | 46 Å/min | 18 Å/min | 43:2.6:1 |
| Case 3/ Comparative Example | 778 Å/min | 66 Å/min | 18 Å/min | 43:3.7:1 |

As shown in Table 1 and FIG. 2, when the wafer may be polished using the slurry composition including the antioxidant such as the polyol, it can be noted that the polishing speeds of the B—Si and the SiN may not be greatly changed and a polishing speed of the TiN may be greatly decreased. As a result, a high polishing selectivity between the B—Si and the TiN may be obtained using slurry compositions Examples 1 and 2 according to embodiments of the present disclosure, compared to the comparative example.

Evaluating Influences of Antioxidants

An abrasive had 3.0 of pH. The abrasive included 1% by weight of silica. 2.0 mM of concentration of $Fe(NO_3)_3$ was used.

A TiN layer had 3.0 of pH. The TiN layer included 1% by weight of TiN. 2.0 mM of concentration of $Fe(NO_3)_3$ was used.

0.005% to 0.05% by weight of 1, 3-propanediol, glycerol and sorbitol as the antioxidant were added to the abrasive and the object, respectively. Zeta potentials of the abrasive and the object were measured. Polyvinyl alcohol (PVA) as a control group was added to the abrasive and the object. A change of the zeta potential was measured. The zeta potential was a unit for predicting a size of a repulsive force between particles.

Figure 3A:
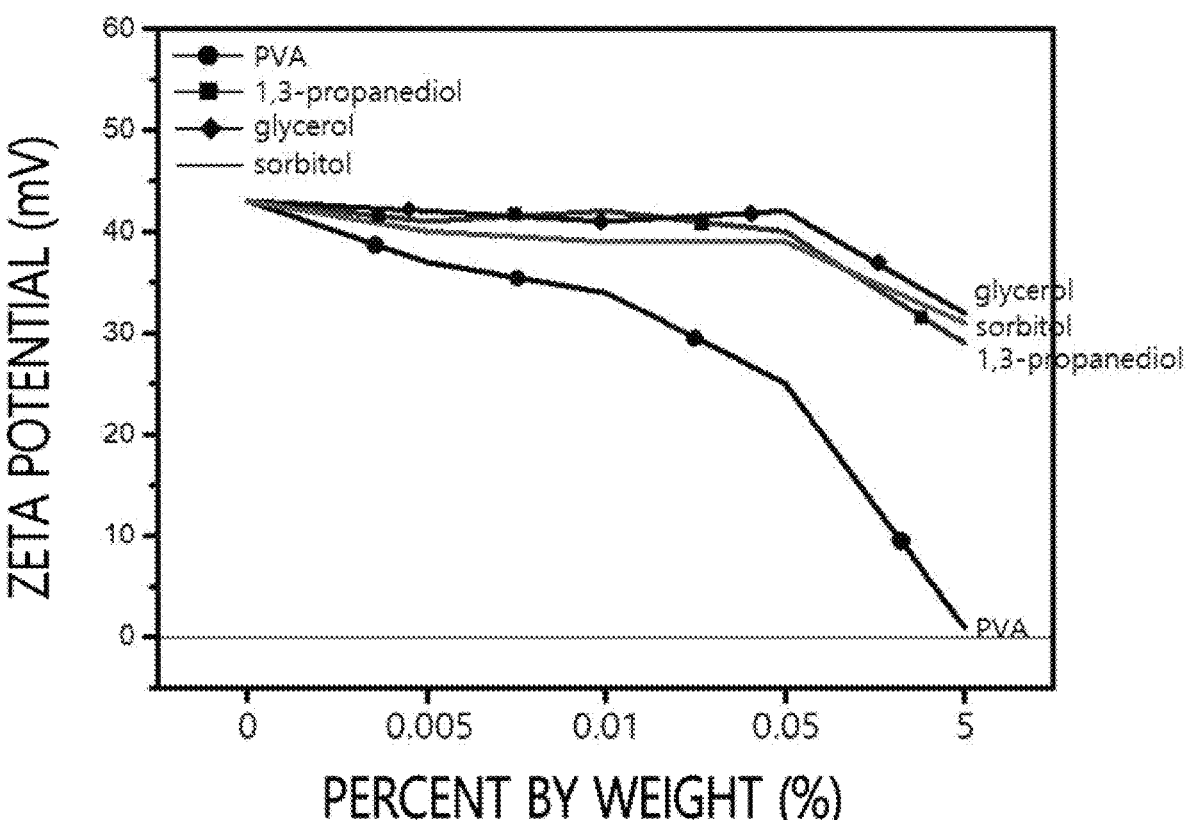
FIG. 3A is a graph showing changes of a zeta potential in an abrasive by adding an antioxidant in accordance with example embodiments.
Figure 3B:
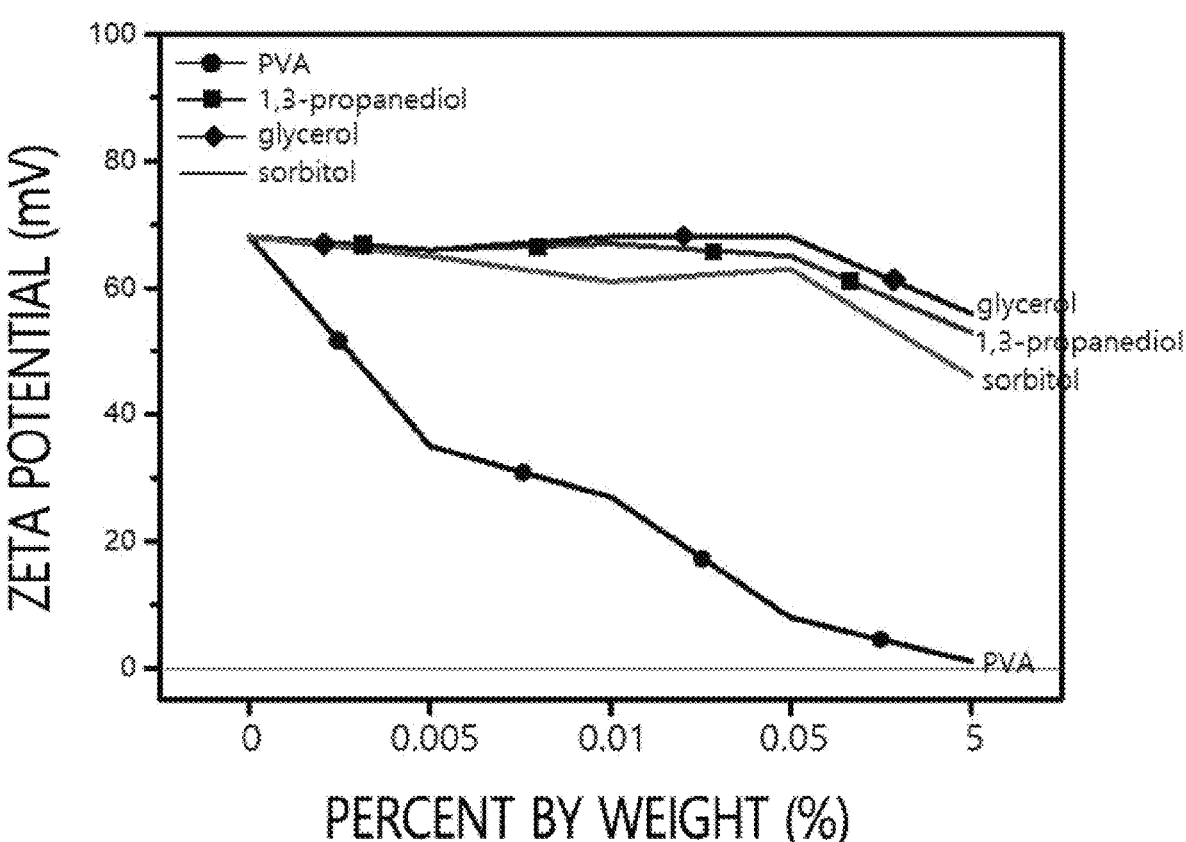
FIG. 3B is a graph showing changes of a zeta potential in an object by adding an antioxidant in accordance with example embodiments.

Referring to FIGS. 3A and 3B, when an amount of the PVA may be increased, it can be noted that the zeta potential of the TiN may be decreased.

In contrast, when 0.005% to 0.05% by weight of 1, 3-propanediol, glycerol and sorbitol as the antioxidant may be added to the slurry composition, it can be noted that the zeta potential of the abrasive and the TiN may not be greatly decreased. Thus, it can be noted that the electrostatic repulsion between the abrasive and the object may be maintained by adding the polyol to the slurry composition. As shown in FIGS. 3A and 3B, a zeta potential of the TiN indicative of the electrostatic repulsion is maintained within a given range (e.g., about 80% to about 100% of the maximum zeta potential) when the slurry composition includes the antioxidant in the range from 0.005% to 0.05% by weight. For example, the zeta potential of the TiN unexpectedly decreases with a relatively high slope when the slurry composition includes the antioxidant in the range above about 0.05% of the antioxidant.

When 5% by weight of the polyol may be excessively added to the slurry composition, it can be noted that the zeta potentials of the abrasive and the TiN may be greatly decreased.

Therefore, it can be noted that the zeta potential may be maintained when the antioxidant such as the polyol of no more than a critical value, for example, 5% by weight may be added to the slurry composition.

Evaluating Anti-Oxidation

The TiN layer was dipped into the slurry composition in Cases 1 to 3. Oxidized area of the TiN by Case 1 to 3 was measured. A control group was a TiN layer not dipped into the slurry composition.

Figure 4:
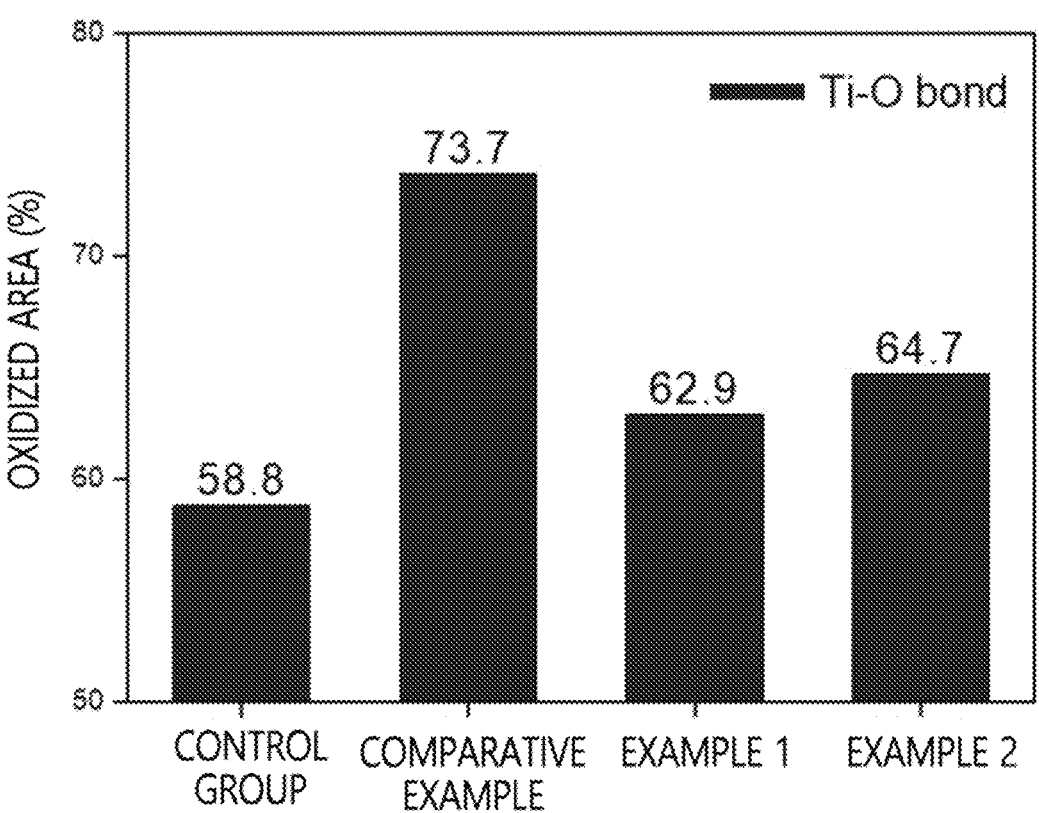
FIG. 4 is a graph showing an oxidized area of an object with respect to a slurry composition in accordance with example embodiments.

Referring to FIG. 4, it can be noted that oxidized areas of the TiN layers dipped into the slurry composition including the polyol in Examples 1 and 2 (or Cases 1 and 2) may not be greatly different from an oxidized area of the control group. In contrast, it can be noted that an oxidized area of the TiN layer dipped into the slurry composition in Comparative Example (or Case 3) may be greatly increased.

Therefore, when the CMP process may be performed using the slurry composition including the polyol, the oxidation of the object may be decreased to reduce a property change of the object.

The above described embodiments of the present disclosure are intended to illustrate and not to limit various embodiments of the present disclosure. Various alternatives and equivalents are possible. Embodiments of the present disclosure are not limited by the embodiments described herein. Nor are embodiments of the disclosure limited to any specific type of semiconductor device. Another additions, subtractions, or modifications may be possible in view of teachings of the present disclosure and are intended to fall within the scope of the appended claims.

What is claimed is:

1. A chemical mechanical polishing (CMP) method comprising:

applying a slurry composition to a wafer; and polishing a surface of the wafer, which includes a storage node electrode, a barrier layer, and an etch stopper, using the slurry composition, wherein the slurry composition comprises polyol absorbed in a surface of the barrier layer by a hydrogen bond.

2. The method of claim 1, wherein the slurry composition further comprises an abrasive and a solvent.

3. The method of claim 1, wherein the polyol comprises polyol in alkane group having a molecular weight of about 10 g/mol to about 1,000 g/mol.

4. The method of claim 1, wherein the polyol comprises any one of ethylene glycol, diethylene glycol, triethylene glycol, tetraethylene glycol, dipropylene glycol, tripropylene glycol, 1,3-propanediol, 1,2-propanediol, 1,4-butanediol, neopentyl glycol, 2-ethyl-2-butylpropanediol, trimethylpentanediol, diethyloctanediol, 1,3-butylene glycol, cyclohexanediol, 1,4-cyclohexanedimethanol, 1,6-hexanediol, 1,2-Cyclohexanediol, 1,4-cyclohexanediol, hydrogenated bisphenol A (2,2-bis (4-hydroxycyclohexyl) propane), 2,2-dimethyl-3-hydroxypropyl, 2,2-dimethyl-3-hydroxypropionate, trimethylolethane, trimethylolpropane, glycerol, ditrimethylolpropane, pentaerythritol, dipentaerythritol, sorbitol, and a combination thereof.

5. The method of claim 1, wherein the slurry composition comprises about 0.005% to about 0.05% by weight of the polyol having a concentration of about 0.01 mM to about 500 mM.

6. The method of claim 1, wherein the barrier layer comprises a TiN layer.

7. The method of claim 6, wherein the storage node electrode comprises a silicon layer doped with boron, and the etch stopper comprises a silicon nitride (SiN) layer.

* * * * *